United States Patent
Choi (10) Patent No.: US 7,143,335 B2
(45) Date of Patent: Nov. 28, 2006

(54) ADD-COMPARE-SELECT ARITHMETIC UNIT FOR VITERBI DECODER

(75) Inventor: Goang-seog Choi, Seongnam-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 892 days.

(21) Appl. No.: 10/189,762

(22) Filed: Jul. 8, 2002

(65) Prior Publication Data

US 2003/0039323 A1    Feb. 27, 2003

(30) Foreign Application Priority Data

Jul. 10, 2001   (KR) ............................ 2001-41215

(51) Int. Cl.
   *H03M 13/03*   (2006.01)

(52) U.S. Cl. .................. 714/795; 714/794; 375/262; 375/341

(58) Field of Classification Search .............. 714/794, 714/795; 375/262, 341
   See application file for complete search history.

(56) References Cited

U.S. PATENT DOCUMENTS

| 5,075,879 A | * | 12/1991 | Anderson | 708/201 |
| 5,546,335 A | * | 8/1996 | Lee | 708/201 |
| 5,905,662 A | * | 5/1999 | Shiraishi | 708/552 |
| 6,370,097 B1 | * | 4/2002 | Hayashi et al. | 369/59.11 |
| 6,813,744 B1 | * | 11/2004 | Traeber | 714/795 |
| 6,865,710 B1 | * | 3/2005 | Bickerstaff et al. | 714/796 |

FOREIGN PATENT DOCUMENTS

KR    2000-0075096 A    12/2000

OTHER PUBLICATIONS

C. Bernard Shung, et al., "VLSI Architectures for Metric Normalization in the Viterbi Algorithm", Proceeding of IEEE International Conference on Communications, No. 16-19, pp. 1723-1728, Apr. 1990.

* cited by examiner

*Primary Examiner*—Albert Decady
*Assistant Examiner*—Esaw T. Abraham
(74) *Attorney, Agent, or Firm*—Sughrue Mion, PLLC (57) ABSTRACT

An add-compare-select (ACS) arithmetic unit for a Viterbi decoder is provided. The ACS arithmetic unit includes two 2's complement adders for performing an operation on a state metric related to a bit value 0 and a state metric related to a bit value 1, respectively; a 2's complement subtractor for performing a subtraction on the outputs of the two 2's complement adders; a multiplexer for selecting the smaller output between the outputs of the two 2's complement adders; an absolute value calculator for calculating an absolute value of the subtraction result of the 2's complement subtractor; a look-up table for calculating a log value corresponding to the absolute value generated from the absolute value calculator; and a subtractor for subtracting the log value, which is provided from the look-up table, from the output of the multiplexer to output a state metric Since the ACS arithmetic unit does not need a comparator, a MUX, and a subtractor, which are necessary for normalization, it can use a high system clock signal Consequently, entire throughput can be increased, and latency can be decreased.

3 Claims, 5 Drawing Sheets

ADD-COMPARE-SELECT ARITHMETIC UNIT FOR VITERBI DECODER

BACKGROUND OF THE INVENTION

1. Field of the Invention

The present invention relates to a Viterbi decoder for turbo decoding, and more particularly, to an add-compare-select (ACS) arithmetic unit for calculating a state metric.

2. Description of the Related Art

Generally, in wireless digital communication, an error correction code is added at a transmitting part and a receiving part compensates for an error using an error correction code in order to compensate for an error in a channel. Since turbo codes were introduced in 1993, they have been applied to high data rate channels in code division multiplex access (CDMA) mainly used in the U.S. and wideband CDMA (WCDMA) mainly used in Europe FIG. 1 shows a typical turbo code encoder having a code rate of ⅓ The output of the encoder at a time instant "k" is divided into an output $X_k$, which is an information bit $d_k$ that is input into the encoder, an output $Y_{1k}$, which is a parity generated from a first coding unit for the information bit $d_k$, and an output $Y_{2k}$, which is a parity generated from a second coding unit for the information bit $d_k$ that is rearranged by an interleaver.

Encoding is performed in units of frames, and the length of a single frame is the same as the size of the interleaver used within the encoder. In general turbo coding, the two coding units of the encoder use recursive systematic convolutional (RSC) codes having the same generated polynomial.

Figure 1:
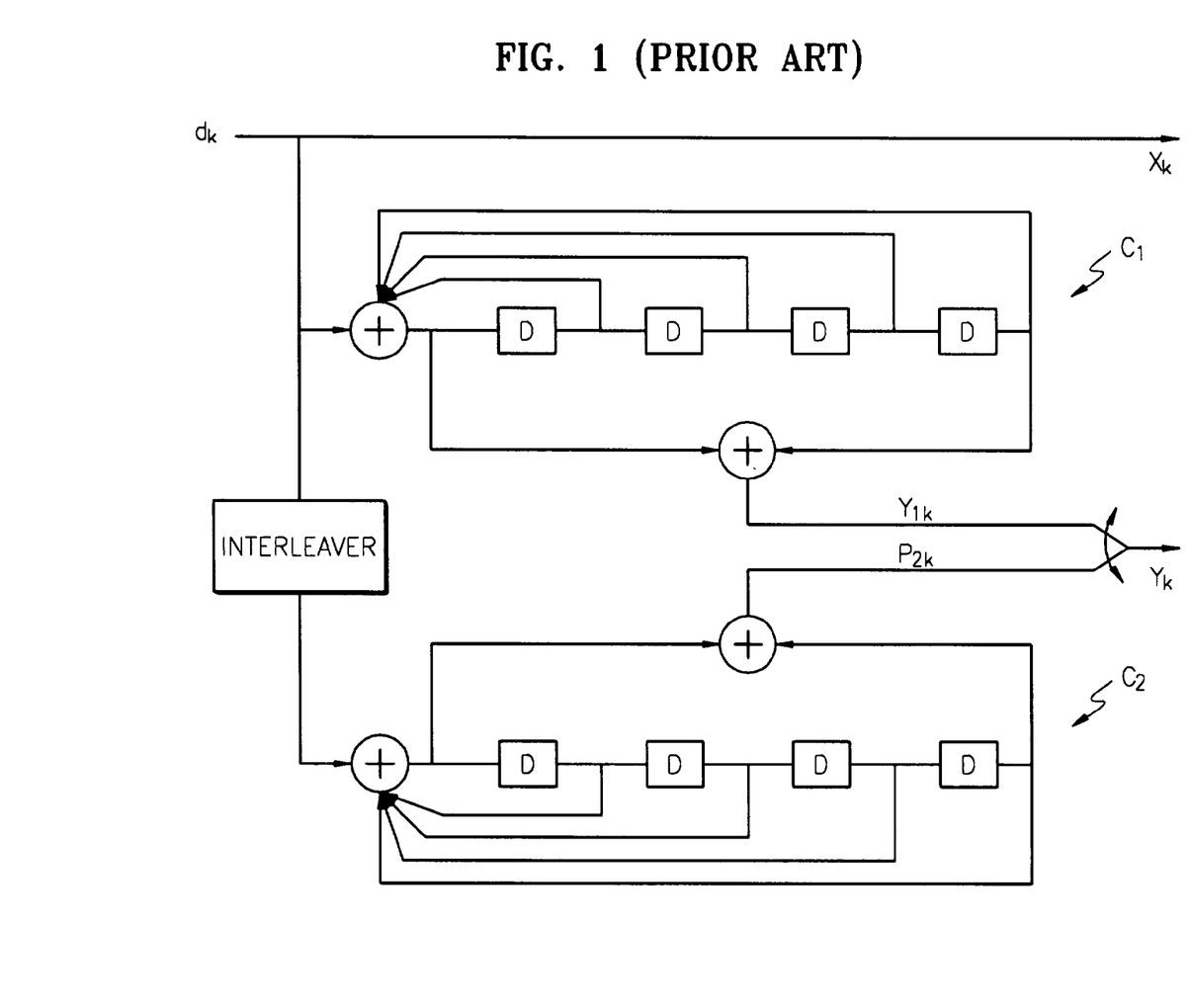
FIG. 1 shows a typical turbo code encoder having a code rate of ⅓.
Figure 2:
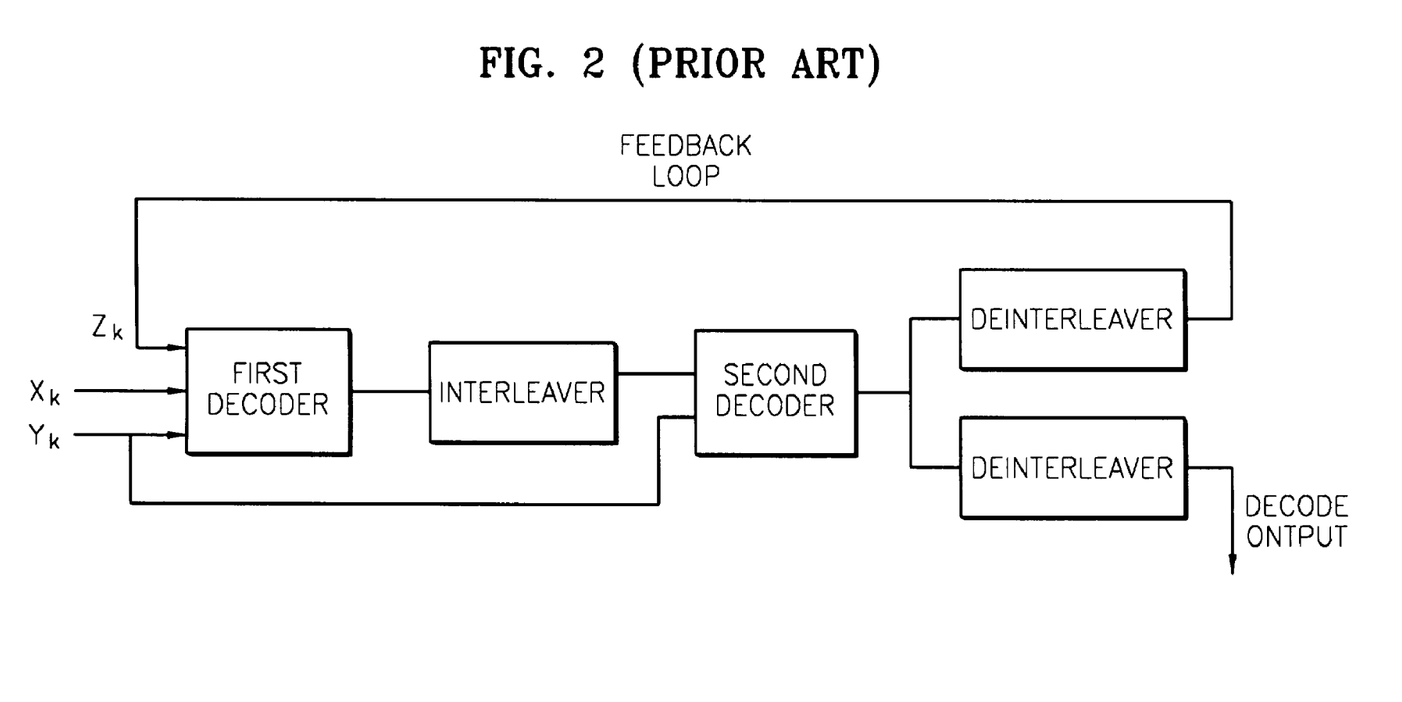
FIG. 2 shows a turbo code decoder corresponding to the turbo code encoder shown in FIG. 1.

FIG. 2 shows a turbo code decoder corresponding to the turbo code encoder shown in FIG. 1 The decoder includes decoding units, which correspond to the coding units of the encoder, respectively, and are connected to each other in series with an interleaver and deinterleavers therebetween As in the encoder, decoding is performed in units of frames For iterative decoding, each decoding unit needs to have an ability of soft output. In FIG. 2, each decoding unit uses Maximum A-Posterior (MAP) or Soft-Output Viterbi Algorithm (SOVA)

It is known that the turbo codes can closely approach the Shannon limit which is a theoretical limit, even at a low receiving power by performing iterative decoding. SOVA and MAP are used for decoding the turbo codes. It is known that MAP has a 0.3 dB higher coding gain in an additive white Gaussian noise (AWGN) environment, in which a channel environment is good, and has a 3 dB higher coding gain in a Rayleigh fading environment, in which a channel environment is poor, than SOVA.

In order to implement an ACS arithmetic unit, which is the most important element of a decoder using MAP for calculating a state metric, normalization is needed.

Since a conventional ACS arithmetic unit requires circuits such as a comparator, a multiplexer, and an adder for normalization, a hardware load is large when a forward state metric and a backward state metric are arranged in parallel in a system In addition, in the conventional ACS arithmetic unit requiring the comparator, the multiplexer, and the adder, a system clock signal cannot be used efficiently. Accordingly, the entire throughput of an integrated circuit cannot be increased, and latency cannot be reduced

SUMMARY OF THE INVENTION

To solve the above-described problems, it is an object of the present invention to provide an add-compare-select (ACS) arithmetic unit, which is applied to a Maximum A-Posterior (MAP) turbo decoder for calculating state metrics without normalization based on the fact that a difference between state metrics is upper bounded, thereby increasing system throughput and realizing efficient ACS and denormalization.

To achieve the above object of the present invention, there is provided an ACS arithmetic unit for a Viterbi decoder. The ACS arithmetic unit includes two 2's complement adders for performing an operation on a state metric related to a bit value 0 and a state metric related to a bit value 1, respectively, a 2's complement subtractor for performing a subtraction on the outputs of the two 2's complement adders; a multiplexer for selecting the smaller output between the outputs of the two 2's complement adders; an absolute value calculator for calculating an absolute value of the subtraction result of the 2's complement subtractor, a look-up table for calculating a log value corresponding to the absolute value generated from the absolute value calculator; and a subtractor for subtracting the log value, which is provided from the look-up table, from the output of the multiplexer to output a state metric.

Preferably, the ACS arithmetic unit further includes a denormalization unit for detecting whether overflow occurs with respect to all state metrics and inverting the most significant bits (MSBs) of all state metrics when it is detected that overflow has occurred.

Since the ACS arithmetic unit uses a modulus operation, normalization is eliminated. In other words, values calculated with respect to different states are not compared, and any subtraction for normalization is not performed.

However, in case of a 10-bit state metric having the form of a 2's complement code, the ACS arithmetic unit according to the present invention permits overflow or underflow since it uses a modulus operation while an entire state metric does not beyond the range of +511~−512 in a conventional ACS arithmetic unit The calculated values at a particular turn (for example, a k-th iterative operation) for calculating a state metric are used as it is at the next turn (for example, a (k+1)-th iterative operation) without specially processing them Only for calculating a k-th log-likelihood ratio (LLR), $L_k$, denormalization is required.

BRIEF DESCRIPTION OF THE DRAWINGS

The above object and advantages of the present invention will become more apparent by describing in detail a preferred embodiment thereof with reference to the attached drawings, in which.

DETAILED DESCRIPTION OF THE INVENTION

Hereinafter, the structure and operations of an embodiment of the present invention will be described in detail with reference to the attached drawings.

Figure 3:
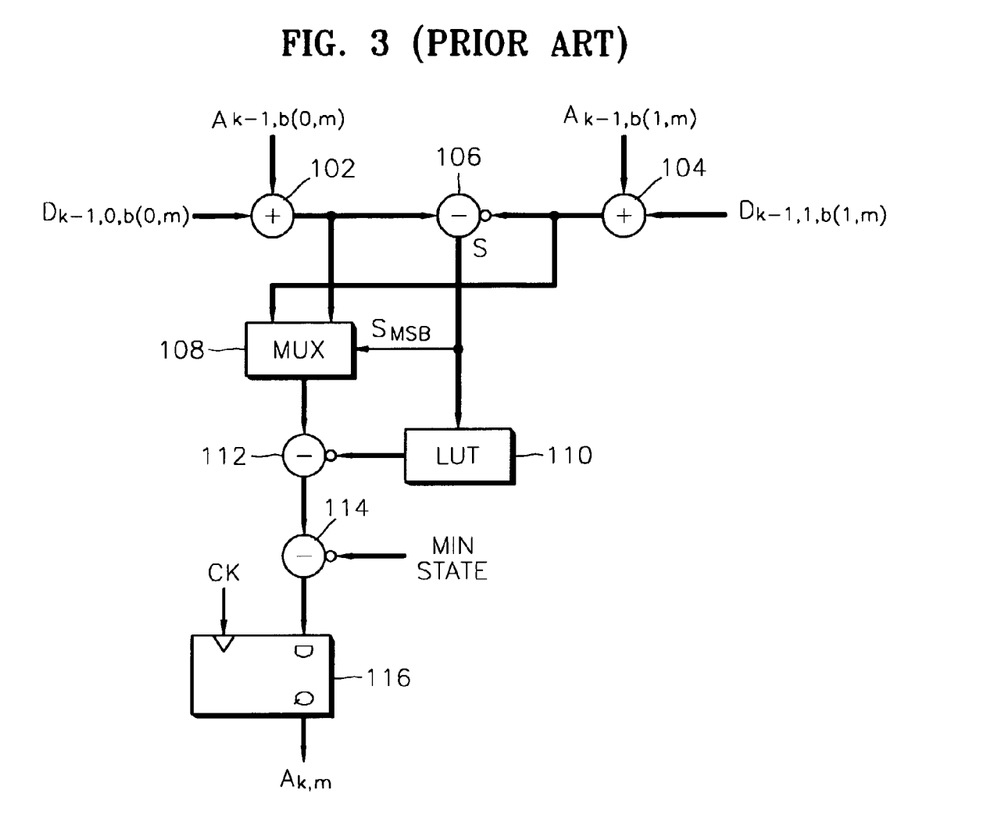
FIG. 3 is a block diagram of a conventional add-compare-select (ACS) arithmetic unit.

A maximum A-posterior (MAP) algorithm is a decoding method for calculating a posteriori probability of an information bit and maximizing the posteriori probability. When the MAP algorithm is applied to Viterbi codes, excellent performance can be achieved, but a large amount of computation is required. Accordingly, the MAP algorithm had rarely been used in an actual system since it was introduced in 1974. However, it was newly noticed after turbo codes were introduced and has been developed and researched very much to reduce the amount of computation in an actual implementation A soft output Viterbi algorithm (SOVA) is based on a Viterbi algorithm and is provided for improving performance by also calculating a reliability in addition to a hard-decision value, which can be obtained using the existing Viterbi algorithm. Since the SOVA was first introduced by Hagenauer et al, various developed types of SOVA have been published The SOVA can be divided into a Hagenauer Rule (HR)-SOVA and a Battail Rule (BR)-SOVA depending on whether the sign of a survivor path is the same as the sign of a concurrent path on a trellis In other words, the HR-SOVA performs update only when the signs of the two paths are different, and the BR-SOVA performs update even if the signs of the two paths are the same Accordingly, the BR-SOVA performing update in all cases is more excellent in performance than the HR-SOVA but is more complicated. A two-step SOVA, as shown in FIG. 3, is frequently used in an actual implementation. The two-step SOVA was produced by Berrou et al. and Meyr et al Unlike existing methods of updating all states of a decoding depth, according to the two-step SOVA, after the maximum likelihood (ML) state is derived using the existing Viterbi algorithm during a predetermined time of trellis T(L), update is performed starting from the derived ML state during only the time of the remaining trellis T' (L')

While the MAP algorithm uses probabilities, the SOVA uses metric values as in the Viterbi algorithm In actually manufacturing hardware, the SOVA, which is inferior in performance to the MAP algorithm but is much simpler than the MAP algorithm, has been widely used. However, with the recent development of hardware technology, cases using the MAP algorithm have been introduced As shown in FIG. 2, a decoder using the MAP algorithm includes two MAP decoders which are concatenated via an interleaver. Extrinsic information generated from the first MAP decoder must be used in the second MAP decoder. To realize this, the algorithm of each MAP decoder must be a soft-input/soft-output decoding algorithm. In addition, a soft-output generated from the second MAP decoder is fed back to the first MAP decoder. Such processes are iterated, so the entire decoding procedure establishes iterative decoding.

In the encoder shown in FIG. 1, an information sequence $d_k$ is input to a first recursive systematic convolutional (RSC) encoder, and a parity $Y_{1k}$ is generated. Simultaneously, the information sequence $d_k$ is input to an interleaver so that it is sufficiently interleaved to eliminate the correlation between information bits within a frame and is then input to the second RSC encoder to generate a parity $Y_{2k}$. If the time taken for interleaving and bits necessary for terminating a trellis are ignored, a code sequence $(X_1Y_{11}Y_{21}, X_2Y_{12}Y_{22}, \ldots, X_kY_{1k}Y_{2k}, \ldots, X_NY_{1N}Y_{2N})$ isformed from the N-bit information sequence $d_k$ ($d_1, d_2, \ldots, d_k, \ldots, d_N$) of a single frame. Here, a code rate R=⅓ (it is apparent that there are cases of puncturing). The code sequence is binary phase shift keying (BPSK) modulated and is then transmitted over a channel In other words, 1 and 0 in the code sequence are converted into transmission symbols −1 and +1, respectively, and the transmission symbols are transmitted over a channel.

The transmission symbols which are received through the channel include various noises This can be expressed by Formulas (1) and (2).

$$x_k = (2X_k - 1) + p_k \quad (1)$$

$$y_k = (2Y_k - 1) + q_k \quad (2)$$

Here, $p_k$ and $q_k$ are independent noises.

The principle of a turbo decoder using the MAP algorithm will be simply described. If it is assumed that a symbol sequence of a single frame received is represented by $R_1^N$, the symbol sequence $R_1^N$ can be expressed by Formula (3).

$$R_1^N = (R_1, \ldots R_k, \ldots R_N) \quad (3)$$

Here, $R_k$ is $(x_k, y_k)$ and indicates symbols received at a time instant "k", and $x_k$ and $y_k$ are the same received symbols as those shown in Formulas (1) and (2).

A likelihood rate $\lambda_k$ related to $d_k$ to be decoded is defined as Formula (4).

$$\lambda_k = P(d_k = 1 | R_1^N)/P(d_k = 0 | R_0^N) \quad (4)$$

Here, $P(d_k = i | R_1^N)$ and i=0 and 1, which indicates A Posteriori Probability (APP) of the information bit $d_k$. The MAP algorithm selects the information bit $d_k$ such that the maximum APP can be obtained.

The first decoder produces the extrinsic information of the information bit $d_k$ using the APP ratio $L_a(d_k)$ of the information bit $d_k$, the symbol value $L(x_k)$ of the received information, and the symbol value $L(y_{1k})$ of the received parity generated from the first encoder $C_1$ In first iteration, the APP ratio $L_a(d_k)$ used by the first decoder is 0. The value of the information bit $d_k$ is 1 or 0. It can be assumed that the APP of the value 1 is the same as the APP of the value 0 at ½ in the transmitting part, so the APP ratio is (½)/(½). However, when it is calculated in a log domain, log1=0. Accordingly, the APP ratio $L_a(d_k)$ is 0. The symbol values $L(x_k)$ and $L(y_{1k})$ are obtained by multiplying the values of $x_k$ and $y_{1k}$ by a channel reliability. The output $L_1(d_k)$ of the first decoder having these input values can be expressed by Formula (5)

$$L_1(d_k) = L_a(d_k) + L(x_k) + L_{e1}(d_k) \quad (5)$$

Here, $L_a(d_k)$ and $L(x_k)$ are inputs. If the inputs are subtracted, the extrinsic information generated from the first decoder becomes $L_{e1}(d_k)$. This term is related to each information bit $d_k$ and is used as the APP ratio of an information bit in the second decoder In the first iteration, the second decoder receives $L_{e1}(d_k)$ of the last term of Formula (5), which is generated from the first decoder, as the APP ratio $L_a(d_k)$ of the information bit $d_k$, the symbol value $L(x_k)$ of the received information, and the symbol value $L(y_{2k})$ of the received parity generated from the second encoder $C_2$ Here, the received parity is obtained after interleaving in the transmitting part, so the extrinsic information $L_{e1}(d_k)$ and the information symbol value $L(x_k)$ are decoded through interleaving.

The output $L_{e2}(d_k)$ of the second decoder is expressed by Formula (6).

$$L_2(d_k)=L_a(d_k)+L(x_k)+L_{e2}(d_k) \quad (6)$$

Here, $L_a(d_k)=L_{e1}(d_k)$, and $L_{e2}(d_k)$ is extrinsic information generated from the second decoder and is used as the APP ratio of the first decoder in the second iteration.

The followings are formulas that are necessary for obtaining the MAP algorithm (in a log domain) for iterative turbo decoding.

$$D_k=-z_k-L_c(x_kd_k+y_kc_k) \quad (7)$$

$$A_{k,m}=\min{}^*(A_{k-1,b(0,m)}+D_{k\ 1,b(0,m)}, A_{k-1,b(1,m)}+D_{k-1,b(1,m)}) \quad (8)$$

$$B_{k,m}=\min{}^*(B_{k-1,f(0,m)}+D_{k,f(0,m)}, B_{k+1,f(0,m)}+D_{k,f(1,m)}) \quad (9)$$

$$L_k=\min{}^*(A_{k,m}+D_{k,f(0,m)}+B_{k+1,f(0,m)})\min{}^*(A_{k,m}+D_{k,f(1,m)}+B_{k-1,f(1,m)}) \quad (10)$$

Here, $\min{}^*(A,B)$ in Formulas (8), (9), and (10) can be expressed by Formula (11).

$$\min{}^*(A,B)=\min(A,B)-\log_e(1+e^{-|A-B|}) \quad (11)$$

Here, "k" indicates a time instant, "m" indicates a state, $d_k$ indicates an information bit, and $c_k$ indicates a parity bit corresponding to the information bit $d_k$ Then, $b(d_k,m)$ and $f(d_k,m)$ indicate a backward state metric and a forward state metric, respectively $L_c$ indicates a channel reliability and is $2/\sigma^2$ ($\sigma^2$ is a noise variance in an additive white Gaussian noise (AWGN)). $D_k$, $A_{k,m}$, and $B_{k,m}$ are a branch metric, a forward state metric, and a backward state metric, respectively, in a log domain.

A forward state metric is calculated in Formula (8), and a backward state metric is calculated in Formula (9) The backward state metric is calculated in the same manner as the forward state metric, and thus the calculation of the forward state metric only will be described.

FIG. 3 is a block diagram of a conventional ACS arithmetic unit. The ACS arithmetic unit includes adders 102 and 104, subtractors 106, 112, and 114, a multiplexer (MUX) 108, and a look-up table (LUT) 110. The two adders 102 and 104 are usual adders which compute state metrics with respect to bit values 0 and 1, respectively, i.e., adders with carry. Reference numeral 116 is a latch unit.

The subtractor 106 and the MUX 108 function as a comparator for selecting the smaller value between the outputs of the adders 102 and 104 The subtractor 106 computes the difference between the outputs of the adders 102 and 104, that is, the difference between a state metric with respect to the bit value 0 and a state metric with respect to the bit value 1. Which is smaller between the two state metrics can be determined based on the most significant bit (MSB) of the difference S ($S_{MSB}$) The MUX 108 selects and outputs one of the outputs of the adders 102 and 104 based on the MSB of the difference S ($S_{MSB}$) which is output from the subtractor 106.

The LUT 110 computes the log term in Formula (11) using the output of the subtractor 106. The subtractor 112 computes the result of Formula (11) and subtracts the output of the LUT 110 from the output of the MUX 108 The subtractor 114 is provided for normalization and subtracts the minimum state metric MIN STATE among all state metrics from the output of the subtractor 112

The operations of the ACS arithmetic unit shown in FIG. 3 will be described in detail.

In order to determine the k-th m-state forward metric $A_{k,m}$, the (k−1)-th forward metrics $A_{k-1,b(0,m)}$ and $A_{k-1,b(1,m)}$ and the (k−1)-th branch metrics $D_{k-1,0,b(0,m)}$ and $D_{k-1,1,b(1,m)}$ are used. The result of $A_{k-1,b(0,m)}+D_{k-1,0,b(0,m)}$ and the result of $A_{k-1,b(1,m)}+D_{k-1,1,b(1,m)}$ are computed by the adders 102 and 104, respectively, and are compared with each other by the subtractor 106. Comparison can be performed through subtraction. When a code system is 2's complement, one of the outputs of the adders 102 and 104 is selected according to the value of the MSB ($S_{MSB}$) of the output of the subtractor 106

Since a current state metric is obtained from accumulation of previous state metrics, it continuously increases, which results in overflow. Accordingly, the minimum state metric among all state metrics is subtracted from the current state metric in order to prevent overflow. This operation is referred to as normalization.

For normalization, the minimum state metric must be selected from all of the state metrics. For example, in case of a system which has 8 states since a constraint length is 4, the minimum state metric is identified using 7 comparators.

In FIG. 3, MIN STATE denotes the minimum state metric among all state metrics. In order to prevent the overflow or underflow of a state metric, each of all state metric is normalized by subtracting minimum state metric MIN STATE therefrom. In other words, a current state metric is obtained from accumulation of previous state metrics, so it continuously increases, which results in overflow. Accordingly, the minimum state metric among all state metrics is subtracted from the current state metric in order to prevent overflow.

In the conventional ACS arithmetic unit shown in FIG. 3, in addition to the adders 102 and 104 for computing state metrics, comparators (not shown) are necessary for finding the minimum state metric among all state metrics and the subtractor 114 is necessary for subtracting the minimum state metric from each of all state metrics. This structure adversely affects the determination of a system clock signal that influences the entire system speed. Accordingly, system latency is long even if the system clock signal is increased by inserting a register.

As described above, since the conventional ACS arithmetic unit shown in FIG. 3 requires the normalization of state metrics, the throughput of the system cannot be improved, and the conventional ACS arithmetic unit occupies a large area when it is manifested as an integrated circuit The conventional ACS arithmetic unit shown in FIG. 3 also uses a LUT for computing a log term. Since the inputs of the LUT are positive and negative numbers, the LUT has a large amount of capacity.

Figure 4:
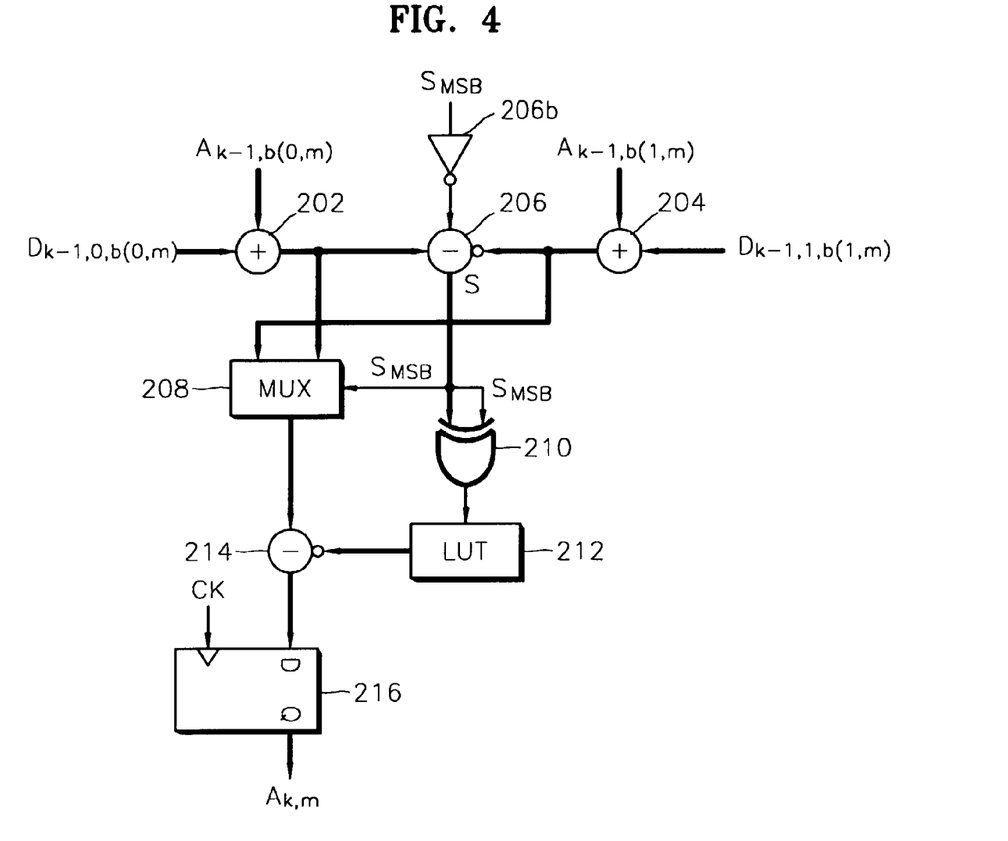
FIG. 4 is a block diagram of an ACS arithmetic unit according to an embodiment of the present invention.

FIG. 4 is a block diagram of an ACS arithmetic unit according to an embodiment of the present invention The ACS arithmetic unit includes two 2's complement adders 202 and 204 for performing an operation on a state metric related to a bit value 0 and a state metric related to a bit value 1, respectively, a 2's complement subtractor 206 for calculating a difference between the outputs of the two 2's complement adders 202 and 204; a MUX 208 for selecting the output having the smaller value between the outputs of the two 2's complement adders 202 and 204, an exclusive OR gate 210 for calculating an absolute value of the output of the 2's complement subtractor 206, an LUT 212 for calculating the log term in Formula (11) using the absolute value generated from the exclusive OR gate 210, and a subtractor 214 for subtracting the output of the LUT 212 from the output of the MUX 208 to generate a state metric $A_{k,m}$. Reference numeral 216 denotes a latch unit.

In FIG. 4, the 2's complement adders 202 and 204, the 2's complement subtractor 206, and the MUX 208 are provided for calculating min(A,B) in Formula (11). The 2's complement subtractor 206, the exclusive OR gate 210, and the LUT 212 are provided for calculating the log term, i.e., $\log_e(1+e^{-|A-B|})$, in Formula (11) The subtractor 214 is provided for calculating the result of Formula (11).

The operations of the ACS arithmetic unit according to the embodiment of the present invention shown in FIG. 4 will be described in detail. In order to determine the k-th m-state forward metric $A_{k,m}$. Additions $A_{k-1,b(0,m)}+D_{k-1,0,b(0,m)}$ (hereinafter, referred to as a term of a bit value 0) and $A_{k-1,b(1,m)}+D_{k-1,1,b(1,m)}$ (hereinafter, referred to as a term of a bit value 1) are performed The calculation of the term of a bit value 0 is performed by the 2's complement adder 202, and the calculation of the term of a bit value 1 is performed by the 2's complement adder 204

Unlike the conventional ACS arithmetic unit shown in FIG. 3, the ACS arithmetic unit according to the present invention shown in FIG. 4 performs additions using a modulus. Here, it is assumed that a state metric is 10-bit 2's complement code (+511~−512) and a branch metric is 6-bit 2's complement code (+31~−32).

For example, it is assumed that the term of a bit value 0 is (−500+−30), the term of a bit value 1 is (−490+−10), and the maximum (or minimum) state metric among all state metrics is −485. Then, a new state metric is −45 (=−530−(−485)) according to the conventional method but is +496 (=−530+512+512) according to the present invention. Since the term of a bit value 0, i.e., −530 is smaller than the term of a bit value 1, i.e., −500, the term of a bit value 0 is selected. Here, the value +496 is a 2's complement of −530.

The above operation is possible on the assumption that all differences between state metrics do not exceed 512 (here, represented by M) If all differences between state metrics do not exceed 256, a state metric can be composed of 9 bits. When the difference between state metrics is larger than M, an actually larger value is recognized as being rather smaller than an actually smaller value during calculation.

The 2's complement subtractor 206 performs a subtraction on the outputs of the 2's complement adders 202 and 204 to calculate a difference between the term of a bit value 0 and the term of a bit value 1

A difference between two values using 2's complement modulo codes can be calculated as follows. A minuend is set as a 1's complement code and is then added to the result of inverting the MSB of the difference between two values. Next, when the MSB of the result of the above operation is 0, the result is immediately defined as the difference between the two values. When the MSB of the result of the above operation is 1, the 2's complement of the result is defined as the difference between the two values For example, in a case of +3−+2, +3 (00000 00011)−+2 (00000 00010)=+3 (00000 00011)+−2 (11111 11110)=+1 (00000 00001). Since the MSB of the result of the above subtraction is 0, the result is immediately defined as the difference between the two values. In case of +2−+3, +2 (00000 00010)−+3 (00000 00011)=+2(00000 00010)+−3 (11111 11101)=−1 (11111 11111). Since the MSB of the result of the above subtraction is 1, the 2's complement of the result, i.e., +1 (00000 00001) is defined as the difference between the two values. These operations can be performed using an inverter 206b of FIG. 4.

In FIG. 4, the MSB of the result of the subtractor 206, i.e., $S_{MSB}$, indicates which is smaller between two values input to the subtractor 206. The MUX 208 selects and outputs the smaller output between the two outputs of the respective 2's complement adders 202 and 204 using the $S_{MSB}$. The exclusive OR gate 210 is used for calculating an absolute value of the difference between the two values.

Although not shown in FIG. 4, the exclusive OR gate 210 is composed of 10 two-input exclusive OR gates because it is assumed here that a state metric is 10-bit 2's complement code The subtraction result of the subtractor 206 has 10 bits, and the 10 bits are input to the 10 exclusive OR gates, respectively. The $S_{MSB}$ is also input to all of the 10 exclusive OR gates. The absolute value of the output of the subtractor 206 is obtained through the operation of the exclusive OR gate 210. The LUT 212 calculates the log term of Formula (11) using the absolute value output from the exclusive OR gate 210. When a unit for performing a log operation is formed using individual circuits, the structure becomes very complicated. However, the unit for the log operation can be simply formed by using the LUT 212. In addition, unlike the conventional ACS arithmetic unit shown in FIG. 3, the inputs of the LUT 212 are limited to positive numbers, so the capacity of the LUT 212 can be reduced to half of the capacity of the LUT 110 shown in FIG. 3. The subtractor 214 calculates the result of Formula (11), i.e., a current state metric $A_{k,m}$.

Through the above operations, the k-th m-state metric is obtained.

The result of modulus operation is characterized by circulation within a predetermined range. For example, the result of 10-bit 2's complement operation circulates in the range of −512~+511. The ACS arithmetic unit according to the present invention can eliminate the normalization, which is required in the conventional ACS arithmetic unit, by using the characteristic of modulus operation.

Figure 5:
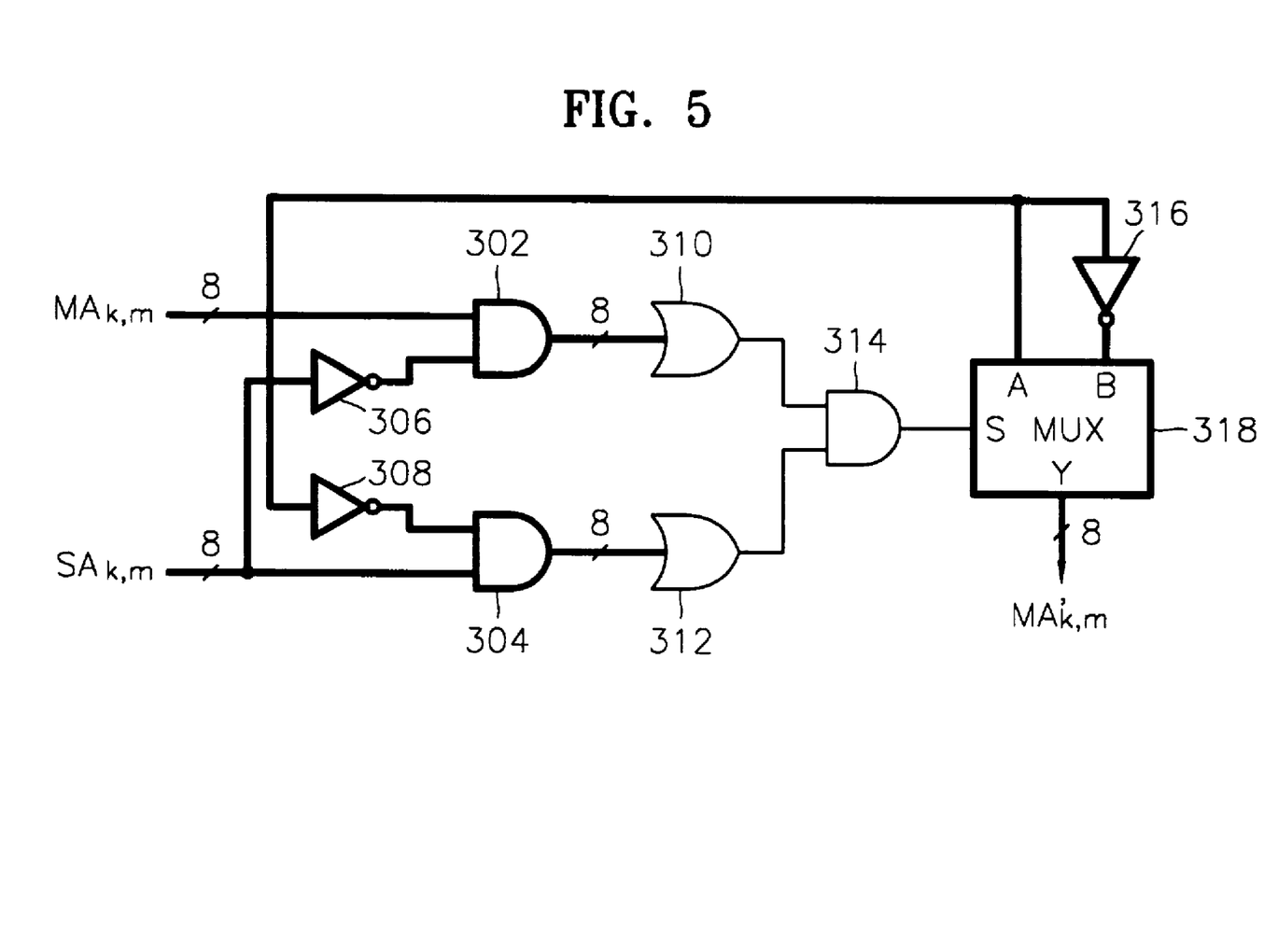
FIG. 5 is a block diagram of a denormalization circuit for the ACS arithmetic unit shown in FIG. 4.

FIG. 5 is a block diagram of a denormalization circuit for the ACS arithmetic unit shown in FIG. 4 The denormalization circuit shown in FIG. 5 includes three AND gates 302, 304, and 314, three inverters 306, 308, and 316, two OR gates 310 and 312, and a MUX 318 which outputs a normal or inverted value according to the output of the AND gate 314.

The denormalization circuit shown in FIG. 5 is required in order to obtain the log-likelihood ratio (LLR) of an information bit, i e., $L_k$, in Formula (10). Simple denormalization can be performed using the MSBs and second MSBs of many state metrics. In FIG. 5, it is assumed that there are 8 state metrics.

$MA_{k,m}$ denotes a group of the MSBs of 8 forward state metrics, and $SA_{k,m}$ denotes a group of the second MSBs of the 8 forward state metrics. In the present invention, since a state metric is obtained through 2's complement modulus operation, an ACS arithmetic unit according to the present invention permits overflow.

The MSBs and the second MSBs have only the values 00, 01, 10, and 11. When the MSBs and the second MSBs of all state metrics simultaneously have the values 01 and 10 at a particular time instant "k", it is determined that there is overflow, and the MSBs of all state metrics are inverted. This means that M (where M is a difference between a state metric related to a bit value 0 and a state metric related to a bit value 1 ) is subtracted from or added to each state metric Consequently, a circumstance not having overflow is produced If it is determined that the MSBs and the second MSBs of all state metrics simultaneously have the values 01 and 10 at the particular time instant "k", it is detected that there is overflow, using the AND gates 302, 304, and 314, the inverters 306 and 308, and the OR gates 310 and 312. The MUX 318 selectively outputs either an original MSB of each state metric or an inverted MSB thereof received from the inverter 316 according to the output of the AND gate 314.

An ACS arithmetic unit according to the present invention does not require additional circuits such as a comparator, a MUX, and a subtractor, which are necessary for normalization performed by a conventional ACS arithmetic unit. In case of a system in which forward state metrics and backward state metrics are configured in parallel, the present invention can reduce a hardware load. Since an ACS arithmetic unit according to the present invention does not need a comparator, a MUX, and a subtractor, which are necessary for normalization, it can use a higher system clock signal than a conventional ACS arithmetic unit. Consequently, entire throughput can be increased, and latency can be decreased. In addition, since an absolute value is input to a LUT, which is provided for calculating a log term, the present invention can reduce the capacity of the LUT to half of that of a conventional LUT.

What is claimed is:

1. An add-compare-select (ACS) arithmetic unit for a Viterbi decoder, comprising:
    two 2's complement adders for performing an operation on a state metric related to a bit value 0 and a state metric related to a bit value 1, respectively;
    a 2's complement subtractor for performing a subtraction on the outputs of the two 2's complement adders;
    a multiplexer for selecting the smaller output between the outputs of the two 2's complement adders;
    an absolute value calculator for calculating an absolute value of the subtraction result of the 2's complement subtractor,
    a look-up table for calculating a log value corresponding to the absolute value generated from the absolute value calculator, and
    a subtractor for subtracting the log value, which is provided from the look-up table, from the output of the multiplexer so as to output a state metric.

2. The ACS arithmetic unit of claim 1, further comprising a denormalization unit for detecting whether overflow occurs with respect to all state metrics and inverting the most significant bits (MSBs) of all state metrics when it is detected that overflow has occurred.

3. The ACS arithmetic unit of claim 2, wherein the denormalization unit comprises,
    an overflow detector for detecting whether overflow occurs by checking the MSBs and the second MSBs of all state metrics,
    an inverter for inverting the MSBs of all state metrics, and
    a multiplexer for selectively outputting either the MSBs of all state metrics or the inverted MSBs of all state metrics, which are output from the inverter, in response to the detection result of the overflow detector.

* * * * *